(12) United States Patent
Chang et al.

(10) Patent No.: US 8,470,158 B2
(45) Date of Patent: Jun. 25, 2013

(54) POROUS METAL ARTICLE AND ABOUT METHOD FOR MANUFACTURING SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Shun-Mao Lin, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/217,909

(22) Filed: Aug. 25, 2011

(65) Prior Publication Data
US 2012/0141820 A1 Jun. 7, 2012

(30) Foreign Application Priority Data
Dec. 1, 2010 (CN) .......................... 2010 1 0568110

(51) Int. Cl.
*C25F 3/04* (2006.01)
(52) U.S. Cl.
USPC ........................................ 205/640; 204/192.1

(58) Field of Classification Search
USPC ......................................... 204/192.1; 205/640
See application file for complete search history.

(56) References Cited

U.S. PATENT DOCUMENTS

| 3,190,749 | A | * | 6/1965 | Fleming ........................ 428/610 |
| 4,977,038 | A | * | 12/1990 | Sieradzki et al. ............. 428/610 |
| 5,378,330 | A | * | 1/1995 | Li et al. ........................ 205/661 |
| 6,210,744 | B1 | * | 4/2001 | Hayess et al. ..................... 427/8 |
| 2003/0143523 | A1 | * | 7/2003 | Kato et al. ........................ 435/4 |
| 2006/0076231 | A1 | * | 4/2006 | Wei .......................... 204/192.12 |
| 2006/0271169 | A1 | * | 11/2006 | Lye et al. ..................... 623/1.39 |

FOREIGN PATENT DOCUMENTS
CN          101337193 A   *   1/2009

* cited by examiner

*Primary Examiner* — Nicholas A Smith
(74) *Attorney, Agent, or Firm* — Altis Law Group, Inc.

(57) ABSTRACT

A porous metal article includes a substrate; a metal layer formed on the substrate; and a porous metal layer formed on the metal layer. The metal layer is a noble metal layer doped with M that is at least one element selected from a group consisting of aluminum, magnesium and calcium, the content of M in the metal layer is between about 30 wt % and about 70 wt %.

14 Claims, 1 Drawing Sheet

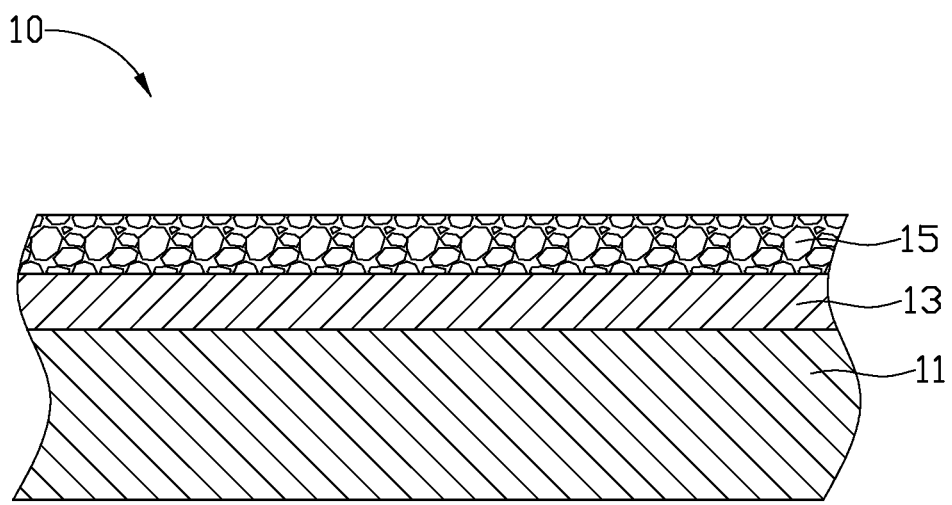

POROUS METAL ARTICLE AND ABOUT METHOD FOR MANUFACTURING SAME

CROSS-REFERENCE TO RELATED APPLICATIONS

The present application is related to co-pending U.S. patent application Ser. Nos. 13/217,906, 13,217,915, respectively entitled "POROUS SILICON ARTICLE AND ABOUT METHOD FOR MANUFACTURING SAME", "POROUS METAL ARTICLE AND ABOUT METHOD FOR MANUFACTURING SAME", by Zhang et al. These applications have the same assignee as the present application and have been concurrently filed herewith. The above-identified applications are incorporated herein by reference.

BACKGROUND

1. Technical Field

The exemplary disclosure generally relates to porous metal articles and methods for manufacturing the porous metal articles.

2. Description of Related Art

Noble metals, such as ruthenium, rhodium, palladium, silver, osmium, iridium, platinum, and gold, are resistant to corrosion and oxidation in moist air. Therefore these materials can be used as accelerators for purifying exhaust gas. The accelerating function of the noble metals is very related to their surfaces. A typical way to improve the accelerating function of the noble metals, is introducing porous holes in their surfaces. However, porous holes in noble metals surfaces may still result.

Therefore, there is room for improvement within the art.

BRIEF DESCRIPTION OF THE DRAWINGS

Many aspects of the exemplary embodiments can be better understood with reference to the following drawings. The components in the drawings are not necessarily drawn to scale, the emphasis instead being placed upon clearly illustrating the principles of the exemplary embodiment of a porous metal article and method for manufacturing the porous metal article. Moreover, in the drawings like reference numerals designate corresponding parts throughout the several views. Wherever possible, the same reference numbers are used throughout the drawings to refer to the same or like elements of an exemplary embodiment.

The FIGURE illustrates a cross-sectional view of an exemplary embodiment of an porous metal article.

DETAILED DESCRIPTION

Referring to FIGURE, an exemplary method for manufacturing a porous metal article 10 may include the least the following steps.

Providing a substrate 11, which may be made of plastic or stainless steel.

The substrate 11 is pretreated. For example, the substrate 11 comprises washed with a solution (e.g., NaOH), and then washed with a deionized water, to remove grease, dirt, and/or impurities, followed by drying.

A green coating is deposited on the substrate 11 in a vacuum sputtering coating machine by physical vapor deposition, such as, magnetron sputtering or cathodic arc deposition. The green coating includes a noble metal and M, wherein M comprises at least one element selected from a group consisting of aluminum, magnesium and calcium. The content of M in the green coating is between about 30 wt % and about 70 wt % of the total weight of noble metal, M. The noble metal layer comprises at least one element selected from a group consisting of ruthenium, rhodium, palladium, silver, osmium, iridium, platinum, or gold. The vacuum sputtering coating machine includes a sputtering coating chamber with a target located in the sputtering coating chamber. The target is an alloy containing noble metal and base metal, the base metal is at least one element selected from a group consisting of aluminum, magnesium and calcium, the content of base metal in the coating is between about 30 wt % and about 70 wt % of the total weight of noble metal, base metal. The noble metal is at least one element selected from a group consisting of ruthenium, rhodium, palladium, silver, osmium, iridium, platinum and gold.

During depositing, the temperature in the sputtering coating chamber is set between about 30 degree Celsius (° C.) and about 70° C. when the substrate 11 is made of plastic, or set between about 30° C. and about 150° C. when the substrate 11 is made of stainless steel. Argon is fed into the sputtering coating chamber at a flux between about 150 Cubic Centimeters per Minute (sccm) and about 500 sccm. The target is evaporated at a power between about 5 kW and about 11 kW for about 60~300 minutes when the green coating is deposited by magnetron sputtering, or evaporated at a power between about 1.5 kW and about 5 kW for about 20~80 minutes when the green coating is deposited by cathodic arc deposition. A bias voltage applied to the substrate 11 comprises between about 0 volts and about −250, to deposit the green coating on the substrate 11. The green coating has a thickness between 2 micrometer and 8 micrometers.

The green coating on the substrate 11 is electrochemically etched to remove M from an outer surface of the green coating to form a porous silicon layer 15 on the outer surface of the green coating. The portion of the green coating in which M is not removed forms a metal layer 13 on the substrate 11. During electrochemical etching, the green coating acts as an anode, a platinum plate acts as cathode, using hydrochloric acid, formic acid, acetic acid, oxalic acid or sulphuric acid as electrolyte. The content of the hydrochloric acid or sulphuric acid is between about 3 wt % and about 15 wt % of the total weight of the electrolyte. A constant power applied between the anode and the cathode may have a voltage between about 2 volts and about 5 volts, a current density between about 0.5 mA/cm2 and about 4 mA/cm$^2$ for about 3 minutes to about 20 minutes to form the porous metal layer 15. The porous metal layer 15 has a thickness between 2 micrometers and 6 micrometers. The porous metal layer 15 defines a plurality of nano-pores, and each nano-pore has a pore opening size between 50 nanometers (nm) and 120 nm. The porous metal layer 15 has a thickness between about 2 micrometers and 6 micrometers.

The porous metal article 10 manufactured by the present method includes a substrate 11, a metal layer 13 formed on the substrate 11, and a porous metal layer 15 formed on the metal layer 13. The substrate 11 comprises made of stainless steel or plastic. The metal layer 13 includes a noble metal and M, wherein M comprises at least one element selected from a group consisting of aluminum, magnesium and calcium. The content of M in the metal layer 13 is between about 30 wt % and about 70 wt % of the total weight of noble metal, M. The noble metal is at least one element selected from a group consisting of ruthenium, rhodium, palladium, silver, osmium, iridium, platinum and gold. The porous metal layer 15 has a thickness between 2 micrometers and 6 micrometers. The porous metal layer 15 defines a plurality of nano-pores, and each nano-pore has a pore opening size between 50 nanometers (nm) and 150 nm.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a porous metal article comprising steps of:
providing a substrate;
depositing a green coating on the substrate, the green coating being directly formed by physical vapor deposition, wherein the green coating consists of at least one noble metal and M, wherein M consists of at least one element selected from the group consisting of magnesium and calcium, the content of M in the green coating is between about 30 wt % and about 70 wt %; and
electrochemically etching the green coating to remove M from an outer surface of the green coating to form a porous metal layer on the outer surface of the green coating using hydrochloric acid, formic acid, acetic acid, oxalic acid or sulphuric acid as electrolyte.

2. The method of claim 1, wherein the substrate is made of plastic or stainless steel.

3. The method of claim 1, wherein the green coating is deposited on the substrate in a vacuum sputtering coating machine by magnetron sputtering, the vacuum sputtering coating machine includes a sputtering coating chamber with a target located in the sputtering coating chamber, the target is an alloy containing noble metal and base metal, the base metal is at least one element selected from a group consisting of magnesium and calcium, the content of base metal in the coating is between about 30 wt % and about 70 wt % of the total weight of noble metal, base metal, the noble metal is at least one element selected from a group consisting of ruthenium, rhodium, palladium, silver, osmium, iridium, platinum and gold.

4. The method of claim 3, wherein during depositing, the temperature in the sputtering coating chamber is set between about 30° C. and about 70° C. when the substrate is made of plastic, or set between about 30° C. and about 150° C. when the substrate is made of stainless steel; argon is fed into the sputtering coating chamber at a flux between about 150 sccm and about 500 sccm; the target is evaporated at a power between about 5 kW and about 11 kW for about 6~300 minutes; a bias voltage applied to the substrate is between about 0 volts and about −250, to deposit the green coating on the substrate.

5. The method of claim 1, wherein the green coating is deposited on the substrate in a vacuum sputtering coating machine by cathodic arc deposition, the vacuum sputtering coating machine includes a sputtering coating chamber with a target located in the sputtering coating chamber, the target is an alloy containing noble metal and base metal, the base metal is at least one element selected from a group consisting of magnesium and calcium, the content of base metal in the coating is between about 30 wt % and about 70 wt % of the total weight of noble metal, base metal, the noble metal is at least one element selected from a group consisting of ruthenium, rhodium, palladium, silver, osmium, iridium, platinum and gold.

6. The method of claim 5, wherein the temperature in the sputtering coating chamber is set between about 30° C. and about 70° C. when the substrate is made of plastic, or set between about 30° C. and about 150° C. when the substrate is made of stainless steel; argon is fed into the sputtering coating chamber at a flux between about 150 sccm and about 500 sccm; the target is evaporated at a power between about 1.5 kW and about 5 kW for about 20~80 minutes; a bias voltage applied to the substrate is between about 0 volts and about −250, to deposit the green coating on the substrate.

7. The method of claim 1, wherein the green coating has a thickness between 2 micrometer and 8 micrometers.

8. The method of claim 1, wherein during electrochemical etching, the green coating is acted as anode, a platinum plate is acted as cathode, using hydrochloric acid or sulphuric acid as electrolyte.

9. The method of claim 8, wherein the content of the hydrochloric acid or sulphuric acid is between about 3 wt % and about 15 wt % of the total weight of the electrolyte.

10. The method of claim 8, wherein a constant power applied between the anode and the cathode may have a voltage between about 2 volts and about 5 volts, a current density between about 0.5 mA/cm$^2$ and about 4 mA/cm$^2$ for about 3 minutes to about 20 minutes to form the porous metal layer.

11. The method of claim 1, wherein the porous metal layer results from portions of the green coating that M is not removed.

12. The method of claim 1, wherein the porous metal layer results from portions of the green coating that M is removed.

13. The method of claim 1, wherein the green coating is deposited on the substrate in a vacuum sputtering coating machine by magnetron sputtering, the vacuum sputtering coating machine includes a sputtering coating chamber with a target located in the sputtering coating chamber, the target is an alloy consisting of noble metal and base metal, the base metal consists of at least one element selected from a group consisting of magnesium and calcium, the content of base metal in the target is between about 30 wt % and about 70 wt %, the noble metal consists of at least one element selected from a group consisting of ruthenium, rhodium, palladium, silver, osmium, iridium, platinum and gold.

14. The method of claim 1, wherein the noble metal consists of at least one element selected from the group consisting of ruthenium, rhodium, palladium, silver, osmium, iridium, platinum, and gold.

* * * * *